United States Patent
Schuurmans et al.

(10) Patent No.: US 9,161,123 B2
(45) Date of Patent: Oct. 13, 2015

(54) CONTROL OF A MICROPHONE

(71) Applicant: NXP B.V., Eindhoven (NL)

(72) Inventors: Han Martijn Schuurmans, Cuijk (NL); Maarten Wilhelmus Henricus Marie Van Dommelen, Nijmegen (NL)

(73) Assignee: NXP B.V., Eindhoven (NL)

(*) Notice: Subject to any disclaimer, the term of this patent is extended or adjusted under 35 U.S.C. 154(b) by 331 days.

(21) Appl. No.: 13/798,846

(22) Filed: Mar. 13, 2013

(65) Prior Publication Data

US 2013/0259242 A1 Oct. 3, 2013

(30) Foreign Application Priority Data

Mar. 30, 2012 (EP) .................................... 12162414

(51) Int. Cl.
| | |
|---|---|
| *H04R 29/00* | (2006.01) |
| *H04R 3/00* | (2006.01) |
| *H03M 1/12* | (2006.01) |
| *H03M 1/18* | (2006.01) |
| *H04R 3/02* | (2006.01) |
| *H03M 3/00* | (2006.01) |

(52) U.S. Cl.
CPC .................. *H04R 3/00* (2013.01); *H03M 1/183* (2013.01); *H03M 3/486* (2013.01); *H04R 3/02* (2013.01); *H03M 3/49* (2013.01); *H04R 2410/00* (2013.01)

(58) Field of Classification Search
None
See application file for complete search history.

(56) References Cited

U.S. PATENT DOCUMENTS

| | | | |
|---|---|---|---|
| 2004/0162043 A1* | 8/2004 | Taubenheim et al. | 455/136 |
| 2008/0218395 A1 | 9/2008 | Tomioka et al. | |
| 2012/0328129 A1 | 12/2012 | Schuurmans | |

FOREIGN PATENT DOCUMENTS

| | | |
|---|---|---|
| EP | 1 439 636 A1 | 7/2004 |
| EP | 2 367 366 A1 | 9/2011 |
| WO | 2011/114300 A1 | 9/2011 |

OTHER PUBLICATIONS

Extended European Search Report for EP Patent Appln. No. 12162414.2 (Sep. 14, 2012).

\* cited by examiner

*Primary Examiner* — Regina N Holder

(57) ABSTRACT

A microphone circuit has a clip detection circuit which detects when an analogue to digital converter output has reached a threshold. A variable attenuator is controlled based on the clip detection circuit output. The feedback is thus based on the ADC output level, and the processing of this signal can be implemented without requiring baseband processing of the signal—it can simply be based on a state of the ADC output. An overrule function is also provided so that the clip detection AGC control can be inhibited or controlled differently.

20 Claims, 5 Drawing Sheets

CONTROL OF A MICROPHONE

CROSS-REFERENCE TO RELATED APPLICATIONS

Figure 1:
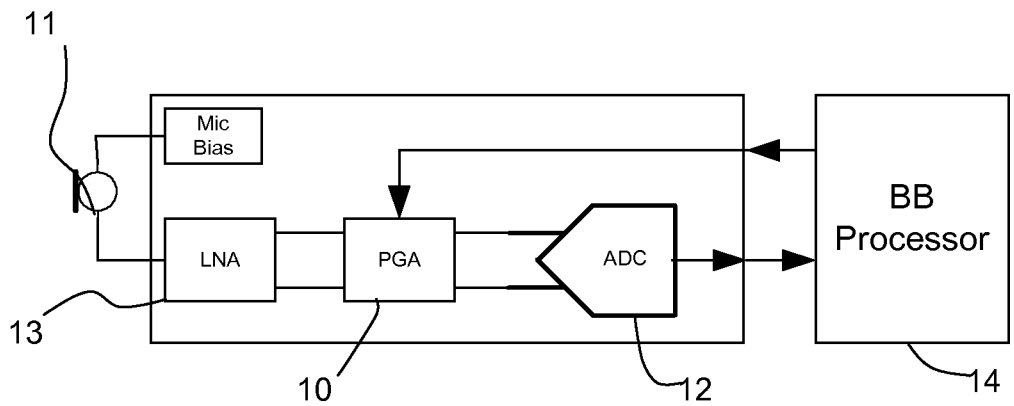

This application claims the priority under 35 U.S.C. §119 of European patent application no. 12162414.2, filed on Mar. 30, 2012, the contents of which are incorporated by reference herein.

This invention relates to the control of a microphone.

Microphones are moving from typical analogue microphones to digital microphone modules. These microphone modules typically consist of a sensor manufactured in a micro-electro-mechanical system (MEMS) process and an analogue to digital converter (ADC). The output of the ADC (typically a sigma delta type converter) is a PDM (pulse density modulation) stream that outputs the data to a baseband processor.

Normal acoustical levels are at about 94 dBSPL (1 pA of sound pressure). The voltage from the microphone sensor is 5 mV @ 94 dBSPL. A required signal to noise ratio for the module is typically 61 dB. This means 64 dB for the sensor and 64 dB for the ADC. The equivalent noise level at the ADC input is 3 μV. These levels are an example only and depend on the type of sensor.

The output voltage of the microphone sensor can be as high as 100 mV, which corresponds to 120 dBSPL. The dynamic range of the ADC then needs to be 90 dB.

For recordings made during rock concerts, very high sound pressure close to the concert speakers overloads the module. As result, the recording sounds distorted when listing afterwards. The MEMS sensor itself is capable of handling sound pressures well above 140 dBSPL before mechanical damage is likely to occur. However, the ADC cannot handle the required signal level and this results in clipped signal.

This invention relates to a system which includes a protection mechanism to prevent the clipping, for example as disclosed in WO2011/114300. This approach is based on clip detection of the microphone AGC, and thereby can be implemented as a fully autonomic process running inside the microphone circuit without requiring any external baseband control.

The invention relates to the problem that there may be instances where it is preferred that such a protection mechanism is not implemented.

According to the invention, there is provided a microphone circuit comprising:
 a microphone;
 an analogue to digital converter at the output of the microphone;
 a clip detection circuit for detecting when the analogue to digital converter output has reached a threshold;
 a variable attenuator associated with the microphone;
 a control circuit for controlling the variable attenuator based on the clip detection circuit output thereby providing autonomic behaviour; and
 an overrule circuit for overruling the autonomic behaviour of the control of the variable attenuator based on clip detection.

The use of an overrule circuit enables the variable attenuation to be switched off or controlled differently. In this way, the circuit can operate in one mode in which there is autonomous and automatic gain control based on ADC clipping, but there is also the possibility to operate a different gain control mechanism.

The variable attenuator can comprise a load, for example a variable capacitance.

The microphone circuit can comprise a format circuit for setting the microphone as a left or right microphone based on a left/right control input to the microphone circuit. This left/right control input is a known control terminal to a microphone circuit. The overrule circuit can then comprise a timing circuit and a controller, wherein the left/right control input is used by the controller to control the overruling operation after a delay set by the timing circuit. This means the normal function of the left/right control input can be kept, which setting the microphone type before the end of the delay set by the timing circuit. The additional functionality then makes use of the right/left control input after the end of the delay. Thus, an existing control pin can be used without disabling the existing function of that control pin.

The overrule circuit can inhibit control of the variable load, so that no attenuation is provided. Alternatively, the overrule circuit can provide control of the variable load taking into account parameters in addition to or instead of the clip detection circuit output. These parameters can be based on detection of how the microphone is being used, or based on user input commands.

The control circuit can comprise a counter, which is controlled to increase in response to one of a clip-detection signal and a no-clip-detection signal, and to decrease the count in response to the other of the clip-detection signal and the no-clip-detection signal.

The invention also provides a method of processing a microphone output signal, comprising:
 converting the analogue output signal of the microphone to digital using an analogue to digital converter;
 implementing clip detection by detecting when the analogue to digital converter output has reached a threshold;
 providing variable attenuation based on the clip detection thereby providing autonomic behaviour; and
 detecting if an overrule command is present, and if present, overruling autonomic behaviour of the control of the variable attenuator based on clip detection.

Figure 2:
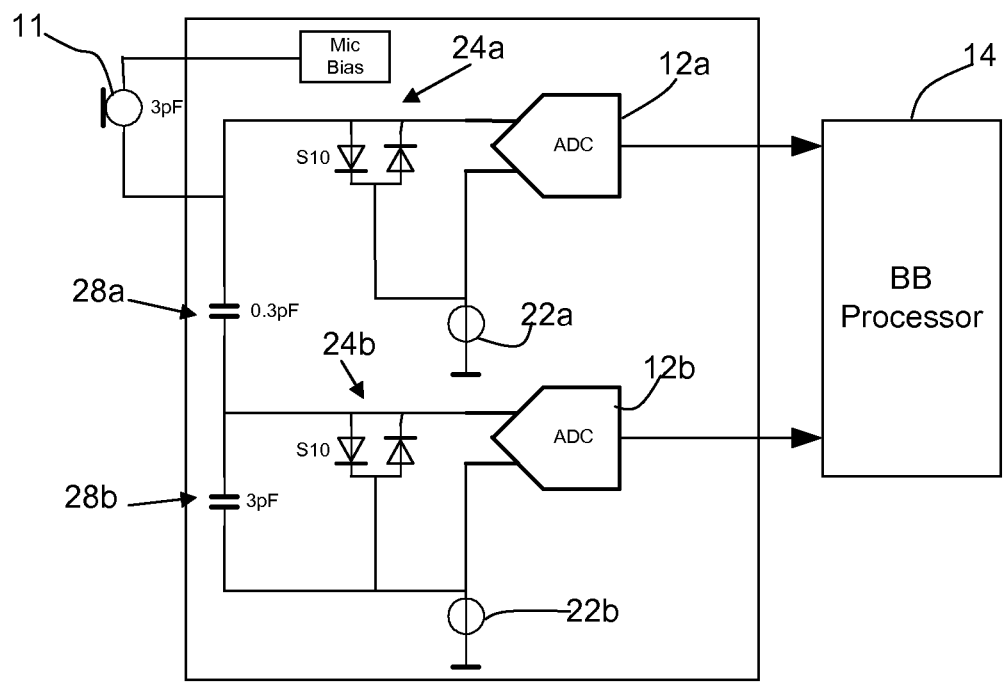
Figure 3:
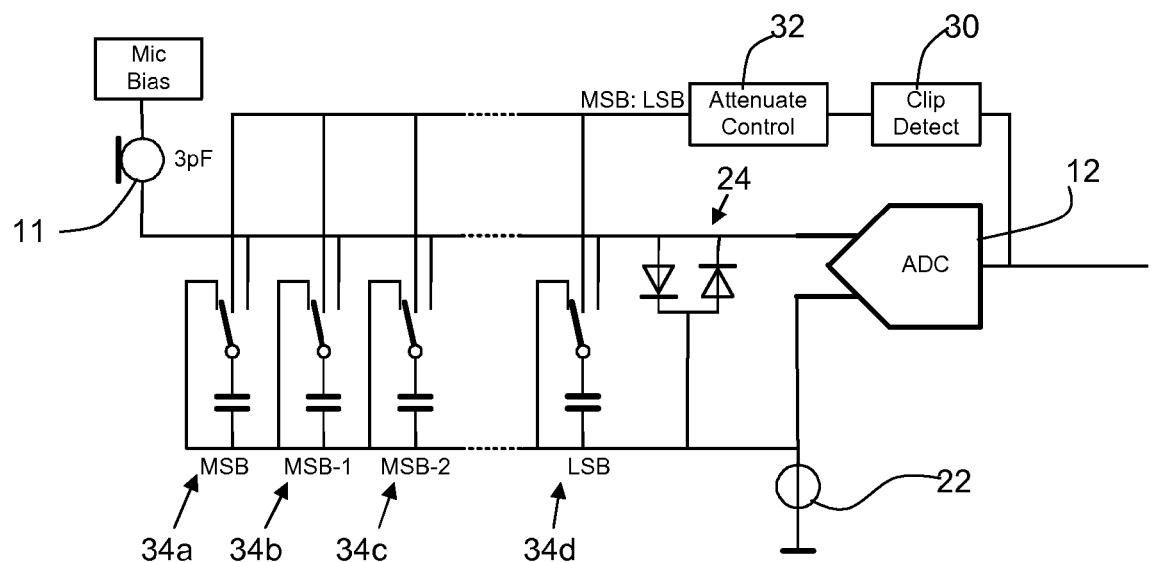
Figure 4:
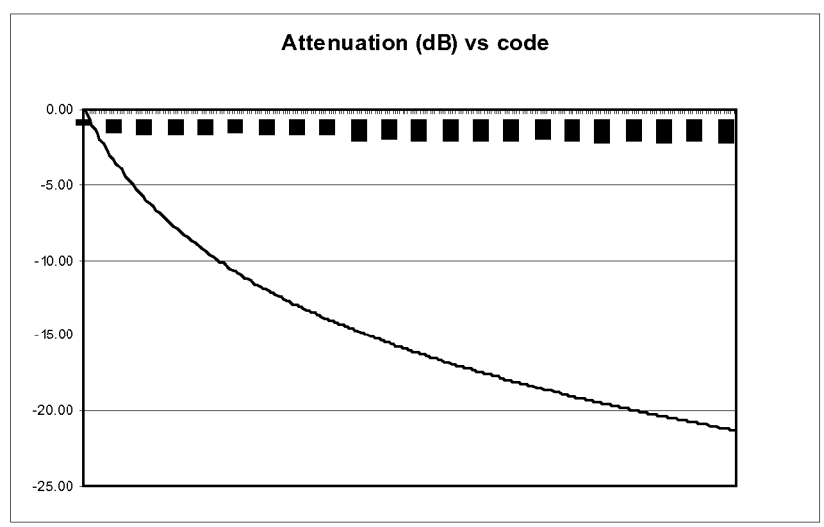
Figure 5:
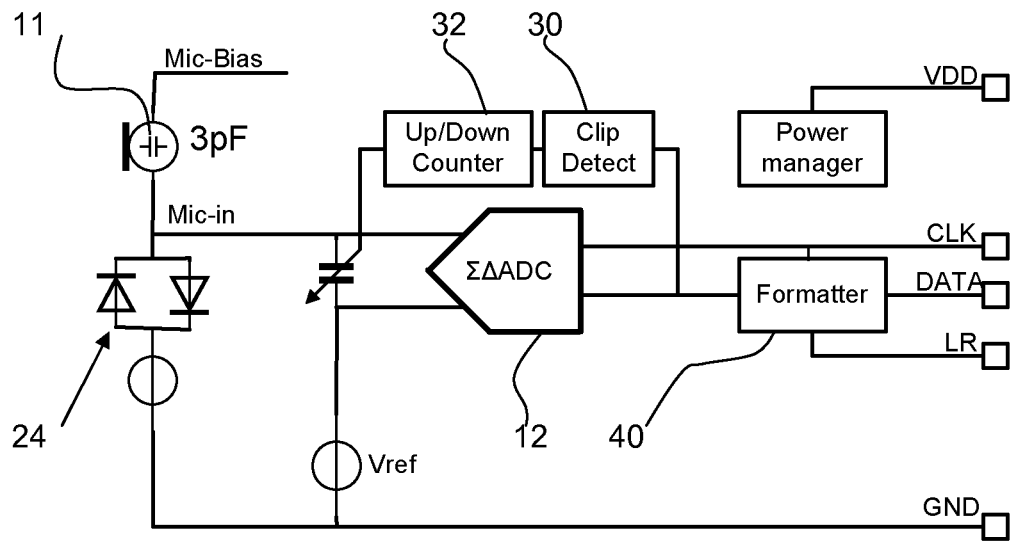
Figure 6:
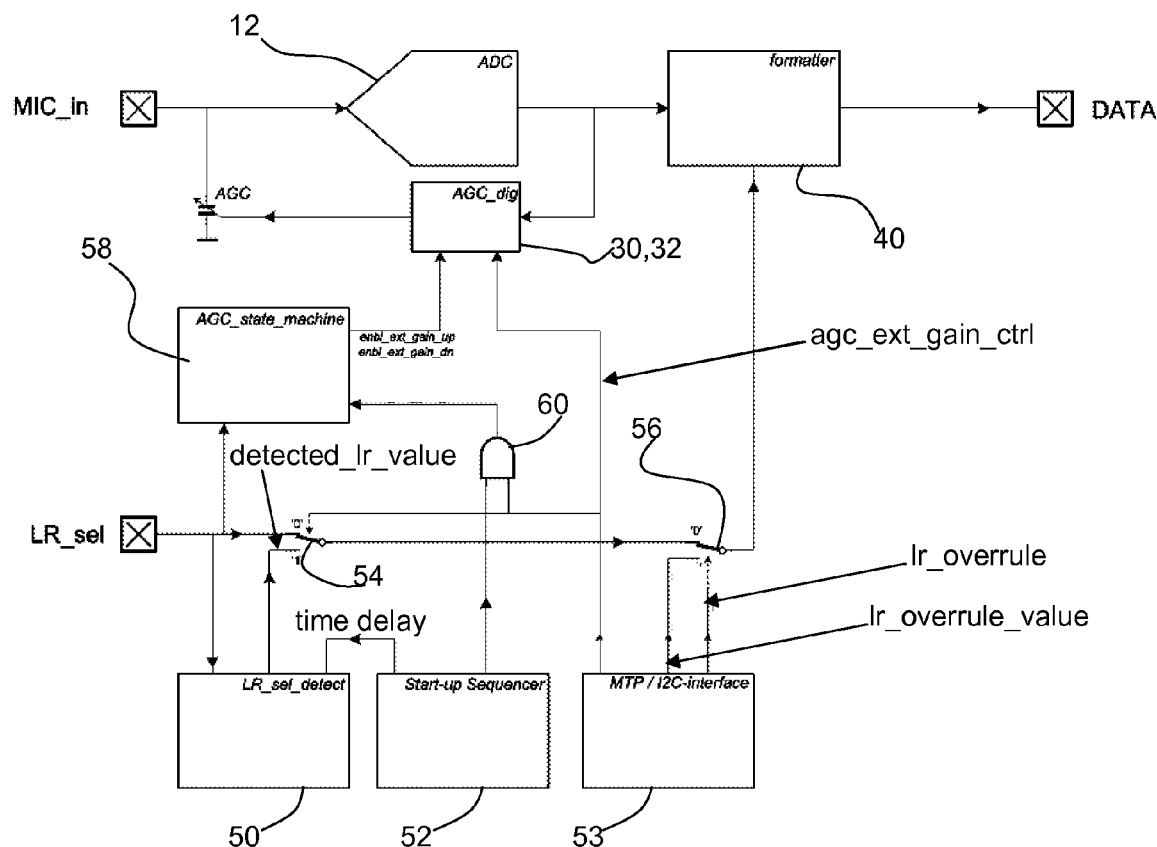
Figure 7:
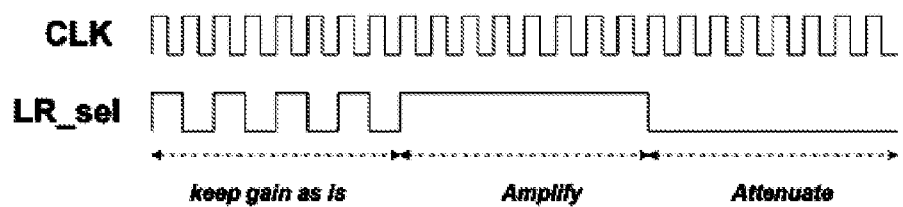
Figure 8:
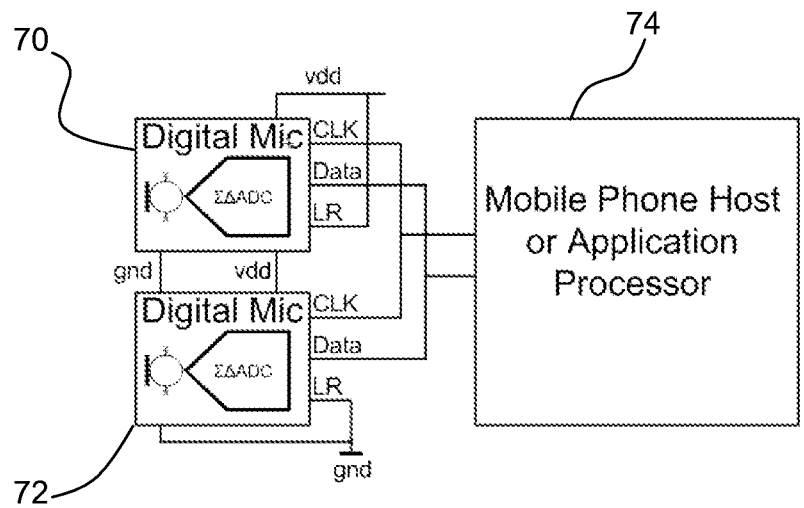
Figure 9:
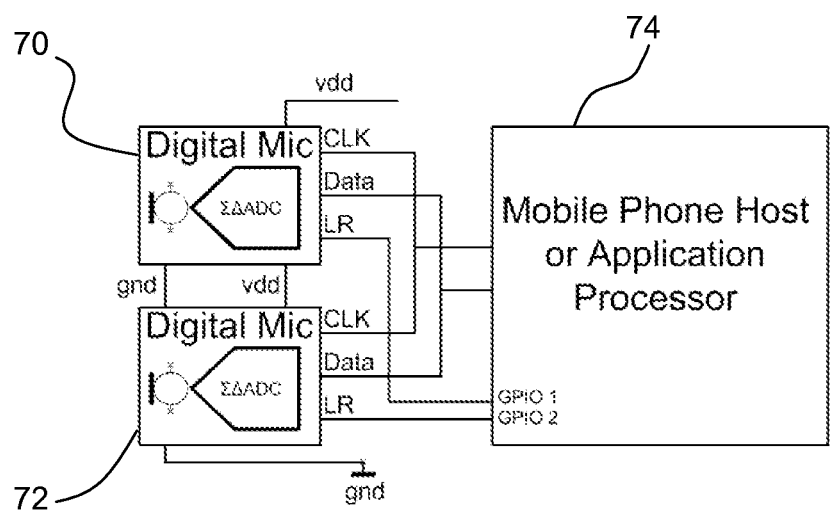

An example of the invention will now be described in detail with reference to the accompanying drawings, in which:
 FIG. 1 shows a first known microphone circuit;
 FIG. 2 shows a second known microphone circuit;
 FIG. 3 shows an example of microphone circuit proposed by the applicant;
 FIG. 4 is used to explain the control scheme employed in the circuit of FIG. 3;
 FIG. 5 shows the control pins for the microphone circuit of FIG. 4;
 FIG. 6 shows an example of microphone circuit of the invention;
 FIG. 7 shows how the gain can be controlled using a command provided to the control pin;
 FIG. 8 shows two microphones configured in conventional manner; and
 FIG. 9 shows two microphones configured using the teaching of the invention.

The invention relates to a circuit which enables the dynamic range of the ADC in a microphone circuit to be extended by implementing an AGC system, and which also allows the circuit to take account of different operating conditions to inhibit or modify the AGC system performance.

The invention provides a microphone circuit with a clip detection circuit associated with an analogue to digital converter. A variable attenuator is controlled based on the clip detection circuit output. The feedback is thus based on the ADC output level, and the processing of this signal can be implemented without requiring baseband processing of the signal—it can simply be based on a state of the ADC output.

An overrule function is also provided so that the clip detection AGC control can be inhibited or controlled differently.

There are several known ways to extend to dynamic range.

A first example is shown in FIG. 1. A programmable gain amplifier (PGA) 10 (programmable from 0 to 20 dB attenuation in e.g. 1 dB steps) is provided at the input of the ADC 12. The programmable amplifier processes the signal of the microphone 11 amplified by a low noise amplifier (LNA) 13. A baseband (BB) processor 14 or other sub system implements the control, and the PGA 10 is set to the appropriate amplification level. A drawback is that the BB processor 14 determines the attack time and is slow. Also, the gain of the PGA (1 dB steps) needs to be compensated otherwise clicks can be audible during switching of the PGA.

In order to overcome the click issue it is also possible to provide two ADCs. A twin ADC arrangement is shown in FIG. 2. The standard ADC 12a handles 100 mV rms. The second ADC 12b handles 1 Vrms (20 dB more). The two paths have a different gain. Thus, there are two data streams (for example PDM streams) coupled to the BB processor 14. The BB processor needs to perform some post processing to combine the two streams into one undistorted signal. Switching over from one stream to the other stream can be very fast and is implemented inside the BB processor. Care needs to be taken in matching the two streams.

Each of the two ADCs has a control circuit in the form of a voltage reference source 22a,22b for setting the voltage on one input of the differential ADC converters, and a high impedance element 24a,24b between the ADC input terminals. In the example shown, this comprises two back to back diodes. These do no conduct, as the input voltage from the microphone is of the order of 100 mV and therefore below the conduction threshold of the diodes. They could be replaced by a different high impedance element.

The different gains for the two paths are implemented by the capacitors 28a,28b which define a capacitor divider network with the capacitance of the microphone.

Compression/decompression systems can also be used. The microphone module then compresses the signal such that it fits the dynamic range of the ADC. In the BB processor, the inverse function is needed and decompresses the signal to regenerate an undistorted audio signal.

The disadvantage of these solutions is that the BB processor needs to implement the dynamic range extension of the microphone module. In all cases, the incoming signal needs to be amplified or attenuated.

This means that specialised control algorithms are required in the baseband controller. Because the control takes place outside the microphone module, a time lag can result in making the required adaptation to the microphone circuit characteristics. The BB processor will also need to have an extended dynamic range corresponding to the extending dynamic range of the microphone circuit.

The applicant has proposed in WO2011/114300 an approach in which the microphone module itself implements the setting of the microphone gain.

This proposal uses a microphone circuit in which a clip detection circuit detects when the analogue to digital converter output has reached a threshold. A variable attenuator, preferably in the form of a variable input load associated with the microphone, is controlled based on the clip detection circuit output. The feedback is thus based on the ADC output level, and the processing of this signal can be implemented without requiring baseband processing of the signal—it can simply be based on a state of the ADC output. As a result, the feedback path can be implemented within the microphone module and before the baseband processing. Thus, the detected signal used to provide feedback control is directly at the output of the ADC.

Since the sample frequency is high, the delay before a clip event is detected is very low. As such the attack time can be fast.

An amplification or attenuation is required, as in the systems described above. The microphone can be considered to have the electrical characteristics of a capacitor. In one preferred implementation, the signal coming from the microphone sensor is attenuated by loaded with a (programmable) capacitor.

FIG. 3 shows the microphone circuit of WO2011/114300. The ADCs are drive in the same way as explained with reference to FIG. 2, with a voltage reference source and a high impedance between the reference input and the microphone analogue input.

The output of the ADC 12 is provided to a clip detection circuit 30. By clipping is meant that the digital output has reached a threshold such that the ADC is at the limit of its preferred range of operation. This clipping can be at or near the maximum digital output of the ADC. However, the signal to noise ratio of the ADC can drop before this maximum value is reached, and the threshold can thus be set lower, for example at 70-90% of the maximum digital output.

The clip detection is used to cause attenuation of the microphone signal. An attenuation control unit 32 generates the required control signal.

The attenuation can be implemented in many different ways, including a programmable amplifier as shown in FIG. 1, but controlled directly by the output of the ADC 12. However, in a preferred implementation as shown in FIG. 3, a variable input load is provided. This is implemented in FIG. 3 as a binary weighted capacitive attenuator, comprising an array of capacitor-switch units 34a, 34b, 34c, 34d.

The array of capacitors is in parallel between the output of the microphone 11 and a control terminal (ground). The capacitors of the array are individually switchable into or out of the parallel circuit by the associated switches.

If a maximum attenuation of 20 dB needs to be achieved, the total capacitance needs a value which is about 10 times higher than the microphone capacitance. In the example of a 3 pF microphone, a maximum capacitance of 30 pF is required. Using a binary weighted function, the capacitors can be set at approximately 16 pF, 8 pF, 4 pF, 2 pF, 1 pF, 0.5 pF, 0.25 pF, 0.125 pF for an 8 bit attenuator. When all capacitors are switched on, the attenuation is maximum.

FIG. 4 shows the attenuation as a function of code for the 8 bit control system outlined above.

The attenuator control can be implemented by means of an up/down counter. In one example, code 0 can signify no attenuation and code 255 signifies maximum attenuation.

As long as the clip detect is active, the counter counts up. This is done in a fast way (attack) and the speed can be programmable. A programmable increment value of 0.04, 0.08 or 0.16 can be used by way of example.

When no clip is detected, the counter counts slowly down, with programmable decrement value of 0.04e-3, 0.08e-3 or 0.16e-3 by way of example, i.e. a factor of 1000 slower than the response to the clip detect signal. However, the counter is running on the same clock as the ADC, so it counts very fast. The counter can be implemented as a real up/down counter, or implemented as a form of integrator.

The clip detector has as input the ADC output.

The type of ADC is typically a 1 bit sigma delta converter. The output is a PDM stream of 1 bit data. The pulse density for a given stream length ranges from 0% (all '0') up to 100%

(all '1'). The ratio between actual number of '1' compared to the maximum number of '1' in a certain time frame of the data stream functions as threshold and determines the actual value of the input signal. For example, for a data stream of 10 bits, if 3 logical '1' values are received from the ADC, it means that a value of 30% of the maximum is coded.

The maximum undistorted output level of a 1 bit sigma delta ADC is in the range of 70%-80%, so that a clip detector can be based on counting the '1's in a stream of 10 bits with a threshold of 8 '1' values (80% of the maximum output). The clip detect signal then becomes active and as result the attenuator control reduces the input signal of the ADC. Since the clip detect acts on the ADC output and by examining 10 bits, a clip detect can be found within 10 clock cycles of the ADC. A typical clock frequency is in the range of 3 MHz. This results in a detection time of about 3 us (10×1/f).

This proposed circuit can be used in a digital microphone module, where increased dynamic range is needed to handle high load events, for example that exceed 120 dBSPL. The baseband processor does not require this extended dynamic range and as such a standard baseband processor can be used without modification.

FIG. 5 shows the circuit of FIG. 3 but showing the external pins to the microphone circuit. They are the high voltage rail VDD, the clock signal CLK, the data input DATA, ground GND and a static LR pin that is used to configure the microphone as a left or right microphone for stereo operation, or to set the microphone to single channel operation. FIG. 5 shows the attenuator control circuit 32 implemented as an up/down counter as explained above.

In some use cases it might be useful to overrule the autonomic behaviour.

In one example, the invention provides this disable or overrule functionality by freeing up a control pin from the existing occupied pins, and applying a new dynamic function to it. In particular, this is possible by re-using the static pin (LR pin) and changing its function after initialization of the device.

The normal functionality of the LR pin is to make it possible that two digital microphones are assigned to be a Left or Right microphone and connected to a 1 bit data bus. This is done by a formatter 40.

When LR="0", data is available when CLK is low, while the data pin becomes tri-state when CLK is high.

When LR="1", data is available when CLK is high and tri-state when CLK is low.

In this way, two microphone circuits can be connected to the same data line, and the Left and Right microphone signals are time interleaved.

In order to support the initial functionality of the LR pin, during a start-up sequence of the device, the level of the LR pin is sampled and stored in a register. In this way, the assignment whether a device is a Left or a Right microphone is fixed during initialization.

In particular, the assignment whether a device is a Left or a Right microphone is determined during the first 10 ms after having applied power to the device and it remains static.

FIG. 6 shows a circuit of the invention which enables the AGC function to be disabled.

The LR input is shown as LR_sel.

The LR_sel detection window is active just before the device is ready to output an audio data bit stream. A first detection unit 50 is used to determine the initial value of the LR input during this detection window, and it provides an output 'detected_lr_value;. The detection window is timed by a sequencing unit 52.

During the initial detection window, the LR_Sel signal is sampled 15 consecutive clock periods (e.g. 150 ms). Every time LR_sel='1', an integrator will be incremented and every time LR_sel='0', an integrator is decremented. This is carried out within the detection unit 50. After 15 clock cycles, the integrator will (nominally) either have the value 15 or −15.

At the end of the initial detection window, the 'detected_l-r_value' will be set to '1' when the integrator value is greater than 1. When the integrator value is not greater than 1, the 'detected_lr_value' will be set to '0'.

An interface 53 is provided which can be used for controlling testing as well as providing a memory function.

The 'detected_lr_value' is provided to the formatter 40 before the audio data bit stream is released to the output. This 'detected_lr_value' is provided to the formatter 40 through a switching arrangement 54,56.

The circuit provides the possibility to have the internal autonomic AGC control overruled, and this overrule function is determined by a MTP (Multi Time Programmable memory) bit 'agc_ext_gain_ctrl'. As shown, this controls the switch 54 and thereby controls whether or not the 'detected_lr_value' signal is sent to the formatter 40.

In one switching state of switch 54, the LR_sel signal is sent to the formatter 40 in normal manner.

In the opposite switching state, which only arises after the initial delay period and only if the overrule control bit 'agc_ext_gain_ctrl' is active, the detected_lr_value is sent to the formatter 40 so that the formatter receives the same signal as in a conventional system.

Switch 54 selects the 'lr_value' either externally from the chip-pin or from the detection circuit 50. By default, the 'lr_value' for the formatter 40 should come directly from the chip-pin. Only when the extended functionality of the LR_sel pin is chosen, the output of the detection unit 50 is fed to the formatter 40.

Switch 56 serves to allow overruling of the lr_value as determined by either the 'LR_sel' pin or the detection unit 50 (depending on the position of switch 54). This overrule function is used for characterization and debugging. Thus, switch 56 is not essential, and is merely a practical detail in the preferred embodiment. When overruled, the interface 53 provides a value 'lr_overrule_value'.

The value of 'detected_lr_value' is stored in a FlipFlop in the detection unit 50. This is intentionally a volatile storage type since every time the chip starts-up, that value is determined again.

Signal 'lr_overrule' from the interface 53 is the signal that controls the switch 56. It originates from the I2C interface which is operated during chip testing and optionally during characterization. In one embodiment, the I2C interface can be used to write data to the MTP. One of the signals that can be stored in MTP (which is non-volatile) is the agc_ext_ctrl signal.

During the start-up sequence, the value agc_ext_gain_ctrl is retrieved from the memory MTP. If the agc_ext_gain_ctrl bit stored in memory 53 has a value '1', then the lr_value presented to the formatter 40 is uncertain until the detection unit 50 has determined a reliable value. This does not result in unexpected behavior on the DATA pin, since the DATA output of the formatter 40 is kept high-impedance until the start-up sequencer 52 indicates it has finished its start-up sequence.

For customers that which to enable the external agc control functionality, bit agc_ext_gain_ctrl can be programmed to '1' during a final test procedure.

A state machine 58 ('AGC_state_machine') determines the new function of the LR pin. The sequencer 52 generates a signal to denote that the initial detection window is completed, and this is used to enable the state machine 58. An AND gate 60 enables the state machine when the initial detection window is complete and when the overrule function is requested (by the 'agc_ext_gain_ctrl' bit).

The state machine provides gain increase and decrease commands to the AGC control units 30,32.

After initialization, the LR pin can control the AGC function in different ways.

The easiest function is to switch on or off the built-in autonomic AGC function. When switched off, the gain is set to the maximum.

For example, for scenarios (ii) and (iii) above, the mobile phone host processor should pull the LR pin low when a phone call is being conducted. In those cases the AGC is switched off.

Another possibility is to let the host processor take over control of the AGC and determine the optimal gain.

With the LR pin the AGC can be set to attenuate, amplify or keep the gain constant. In FIG. 7, one possible format is shown.

If the LR pin is set to '0' there is increased attenuation, if the LR pin is set to '1' there is reduced attenuation, and the gain is kept constant by applying an alternating signal CLK/2 to the LR pin.

This requires more intelligence inside the host, since it needs to take over the AGC function by measuring the signal and controlling the gain.

The above mentioned applications are only examples, and any other function could be given to the LR pin to control the AGC function.

The overrule function can be automatic as described above based on detection of particular use cases where the gain reduction is a problem, or it may be manual, based on user input.

FIGS. 8 and 9 show two microphone circuits 70,72 connected to a mobile phone host or application processor 74.

FIG. 8 shows normal usage of the LR pin, in which LR pin is connected to either the gnd ("0") or vdd ("1"), and FIG. 9 shows the overrule function being implemented by general purpose input/output (GPIO) pins of the host processor.

One example circuit has been given above. However, the desired circuit function can be implemented in many different ways.

Broadly, the invention provides a microphone circuit with an AGC function which controls a variable attenuator, based on detected clipping of an amplifier. The AGC function can be enabled or disabled. The preferred example makes use an existing LR pin which only has its intended functionality during a start-up phase. By making use of the LR pin, no additional input terminals are required to the microphone circuit. However, the microphone circuit can instead be provided with a dedicated input terminal for the AGC overrule command.

The variable attenuator is shown above as a variable load, but it may be implemented by a programmable gain amplifier.

The invention has been described with reference to a one bit sigma delta converter. However, the ADC clipping detection can be implemented with other converters, such as multi-bit sigma delta, mash and nyquist ADCs.

The static gain control has been shown based on a differential ADC with a reference voltage to one input. However, other control or biasing schemes can be combined with the attenuation control of the invention.

The capacitor array can be replaced with a different variable load, for example not a purely capacitive load, as long as the result is that the microphone signal is attenuated before being processed by the analogue to digital Various modifications will be apparent to those skilled in the art.

The invention claimed is:

1. A microphone circuit comprising:
a microphone;
an analog to digital converter at the output of the microphone;
a clip detection circuit configured to detect when the analog to digital converter output has reached a threshold;
a variable attenuator coupled to the microphone;
a control circuit configured to control the variable attenuator based on output of the clip detection circuit; and
an overrule circuit configured to overrule the control circuit.

2. The circuit as claimed in claim 1, wherein the variable attenuator comprises a variable load.

3. The circuit as claimed in claim 1, wherein the microphone circuit further comprises:
a format circuit configured to set the microphone during initialization as a left microphone or a right microphone based on a left/right control input to the microphone.

4. The circuit as claimed in claim 3, wherein the overrule circuit comprises:
a timing circuit; and
a controller, wherein the left/right control input is used by the controller to control the overruling operation after a delay set by the timing circuit.

5. The circuit as claimed in claim 4, wherein the left/right control input is used by the format circuit before the end of the delay set by the timing circuit.

6. The circuit of claim 4, wherein the delay set by the timing circuit is longer than the initialization.

7. The circuit as claimed in claim 1, wherein the overrule circuit inhibits the control of the variable attenuator.

8. The circuit as claimed in claim 1, wherein the overrule circuit is configured to provide the control of the variable attenuator taking into account parameters in addition to or instead of the output of the clip detection circuit.

9. The circuit as claimed in claim 1, wherein the control circuit comprises:
a counter, which is controlled to increase a count in response to one of a clip-detection signal and a no-clip-detection signal, and to decrease the count in response to the other of the clip-detection signal and the no-clip-detection signal.

10. The circuit as claimed in claim 1, wherein the analog to digital converter comprises:
a 1 bit sigma delta converter with a pulse density modulation signal.

11. The circuit as claimed in claim 10, wherein the clip detection is based on the pulse density modulation signal reaching a threshold.

12. The circuit of claim 1, wherein automatic gain control (AGC) is switched off after the overrule circuit overrules the control circuit.

13. The circuit of claim 1, wherein a host processor is configured to take over control of automatic gain control (AGC) after the overrule circuit overrules the control circuit.

14. The circuit of claim 1, wherein the overrule circuit comprises a dedicated input terminal for an AGC overrule command.

15. The circuit of claim 1, wherein the variable attenuator comprises a programmable gain amplifier.

16. A method of processing a microphone output signal, comprising:
converting an analog output signal of a microphone to digital using an analog to digital converter;
implementing clip detection by detecting when the analog to digital converter output has reached a threshold;

controlling a variable attenuator coupled to the microphone based on the clip detection; and detecting if an overrule command is present, and if present, overruling the controlling of the variable attenuator based on the clip detection.

17. The method as claimed in claim 16, wherein the controlling comprises:

operating a counter, which is controlled to increase the count in response to one of a clip-detection signal and a no-clip-detection signal, and to decrease the count in response to the other of the clip-detection signal and the no-clip-detection signal.

18. The method as claimed in claim 16, wherein the converting comprises:

using a 1 bit sigma delta converter with a pulse density modulation output.

19. The method as claimed in claim 16, further comprising:
using the left/right control input to control the overruling operation after the initialization.

20. The method as claimed in claim 16, wherein the overrule function inhibits control of the variable attenuator or provides control of the variable attenuator taking into account parameters other than the clip detection.

* * * * *